(12) United States Patent
Yamaguchi et al.

(10) Patent No.: US 7,303,859 B2
(45) Date of Patent: *Dec. 4, 2007

(54) PHOTORESIST, PHOTOLITHOGRAPHY METHOD USING THE SAME, AND METHOD FOR PRODUCING PHOTORESIST

(75) Inventors: Takako Yamaguchi, Kanagawa (JP); Yasuhisa Inao, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/439,983

(22) Filed: May 25, 2006

(65) Prior Publication Data

US 2006/0263722 A1 Nov. 23, 2006

Related U.S. Application Data

(62) Division of application No. 10/938,586, filed on Sep. 13, 2004, now abandoned, which is a division of application No. 10/165,317, filed on Jun. 10, 2002, now Pat. No. 6,849,391.

(30) Foreign Application Priority Data

Jun. 12, 2001 (JP) .............................. 2001/176931
May 15, 2002 (JP) .............................. 2002/140287

(51) Int. Cl.
*G03F 7/30* (2006.01)
*G03F 7/023* (2006.01)

(52) U.S. Cl. ...................... 430/313; 430/192; 430/193; 430/317; 430/320

(58) Field of Classification Search ................ 430/313, 430/317, 192, 193, 320
See application file for complete search history.

(56) References Cited

U.S. PATENT DOCUMENTS

| 4,859,563 A | 8/1989 | Miura et al. ................. 430/192 |
| 6,171,730 B1 * | 1/2001 | Kuroda et al. .................. 430/5 |
| 6,395,447 B1 | 5/2002 | Ishii et al. ................... 430/191 |
| 6,497,996 B1 | 12/2002 | Naya et al. .................. 430/323 |
| 6,849,391 B2 * | 2/2005 | Yamaguchi et al. ......... 430/326 |
| 2006/0003269 A1 * | 1/2006 | Ito et al. ..................... 430/323 |

FOREIGN PATENT DOCUMENTS

| JP | 7-106229 | 4/1995 |
| JP | 7-319157 | 12/1995 |
| JP | 11-145051 | 5/1999 |

* cited by examiner

*Primary Examiner*—John S. Chu
(74) *Attorney, Agent, or Firm*—Fitzpatrick, Cella, Harper & Scinto (57) ABSTRACT

There is provided a positive photoresist for near-field exposure excellent in light utilization efficiency even with small layer thickness of the photoresist layer for image formation, and allowing for reduced pattern edge roughness, and a photolithography method including a step of exposing by the near-field exposure the photoresist layer for image formation made thereof. In a positive photoresist containing an alkali-soluble novolak resin and a quinone diazide compound, the film thickness of the photoresist at the time of exposure is not larger than 100 nm, and the absorption coefficient of the photoresist $\alpha$ ($\mu m^{-1}$) for the exposure light is such that $0.5 \leq \alpha \leq 7$.

3 Claims, 7 Drawing Sheets

PHOTORESIST, PHOTOLITHOGRAPHY METHOD USING THE SAME, AND METHOD FOR PRODUCING PHOTORESIST

CROSS-REFERENCE TO RELATED APPLICATIONS

This application is a division of application Ser. No. 10/938,586, filed Sep. 13, 2004, now abandoned, which in turn, is a division of application Ser. No. 10/165,317 filed Jun. 10, 2002, now U.S. Pat. No. 6,849,391.

BACKGROUND OF THE INVENTION

1. Field of the Invention

The present invention relates to a photoresist which is used for photolithography to form patterns inclusive of fine patterns equal to or smaller in size than the light wavelengths of the exposure light, and the photolithography using thereof.

2. Related Background Art

Recently, it has become indispensable to make photolithography further finer, with the developments of large capacity semiconductor memories and speed-enhancement and large-scale integration of CPU processors.

The lights used in photolithography apparatuses have continued to become shorter in wavelengths as means for making photolithography finer, and at present near ultraviolet laser lights are used and hence it is possible to make microfabrication of the order of 0.1 μm.

In order to make photolithography much finer, however, there are many problems to be solved, including the further shortening of laser wavelengths, development of lenses usable in such wavelength regions, miniaturization of equipments, etc.

On the other hand, methods which use near-field light have been proposed for the purpose of optical manufacturing of photoresist patterns with widths not larger than the wavelengths of the lights used.

For example, Japanese Patent Application Laid-Open No. 7-106229 discloses a method for near-field exposure based on a probe scanning which uses a probe made by sharpening a tip of an optical fiber by wet etching.

In addition, for the purpose of solving the problem that the above-mentioned method is slow in throughput, many proposals such as Japanese Patent Application Laid-Open No. 11-145051 are made on the en bloc near-field exposure with photomasks.

The merits provided by near-field exposure are that the minimum fabricable pattern width is independent of the wavelength of a light used, but is determined by the aperture of the probe and photomask used. Thus, if a semiconductor laser, for example, is used as a light source for exposure, there is a merit that the apparatus can be made smaller owing to the extremely reduced size of the light source, which also reduces the unit cost of an exposure apparatus.

Accordingly, since the exposure sensitivity of the photoresist is effective in the exposure light wavelengths of about 200 to 500 nm, a blue semiconductor laser can be used as an exposure light source within this range to make the apparatus compact. Alternatively, a general-purpose mercury-arc lamp can be used to provide the exposure light of a high output power, where it is preferable to use the g-line and i-line photoresists in consideration of photoresist sensitivity.

Furthermore, the g-line and i-line photoresists are at present used as general-purpose materials, large in variety, easily available, and inexpensive, and hence there is a merit that the degree of freedom for process is high and the cost can be reduced. Since in the near-field exposure, the width magnitude of the fabricable pattern is not limited by the light wavelength used, there is a possibility that the microfabrication can be made with the g-line and i-line photoresists.

As the g-line and i-line photoresists, the alkali-soluble novolak resins containing a compound comprising the naphthoquinone diazide group as a photosensitive agent have long been used. In Japanese Patent Application Laid-Open No. 7-319157, an example for the above-mentioned photoresist is disclosed, where a high etching-selectivity is shown to be generated in the patterns obtained by the i-line exposure. Since commercially available g-line or i-line photoresists, inclusive of the above-mentioned case, are supposed to be used in the conventional photolithography that employs steppers and aligners, that is, in a method that employs for exposure a light passing through apertures of a photomask but not in the near-field exposure, the minimum pattern width corresponds to the resolution of the order of several hundreds nm to several μm, and the photoresist-film thickness is usually set to be about 0.5 to 1 μm or larger. For example, in Japanese Patent Application Laid-Open No. 7-319157, a case of the film thickness of 1.5 μm is disclosed.

In the conventional photolithography methods, mercury-arc lamps and excimer lasers are used as exposure light sources, so that the exposure intensities fall in the range of several tens to several hundreds $mJ/cm^2$. The photoresists used are required to have sufficient sensitivities for these exposure intensities, and to have such film thicknesses that they can tolerate etching in substrate processing subsequent to pattern formation.

In the near-field exposure method, however, the photoresist-film thickness cannot be as thick as those in the conventional methods. The reasons for this will be described below.

In the near-field exposure, since a photoresist is exposed to the scattered light produced by disturbing the near-field light with the photoresist, there is observed a tendency that the large thickness of the image-forming photoresist layer results in the large widths of the formed patterns. This is illustrated in FIGS. 4A and 4B, where reference numeral 204 denotes a mask base and 205 denotes a light shielding film.

Figure 4A:
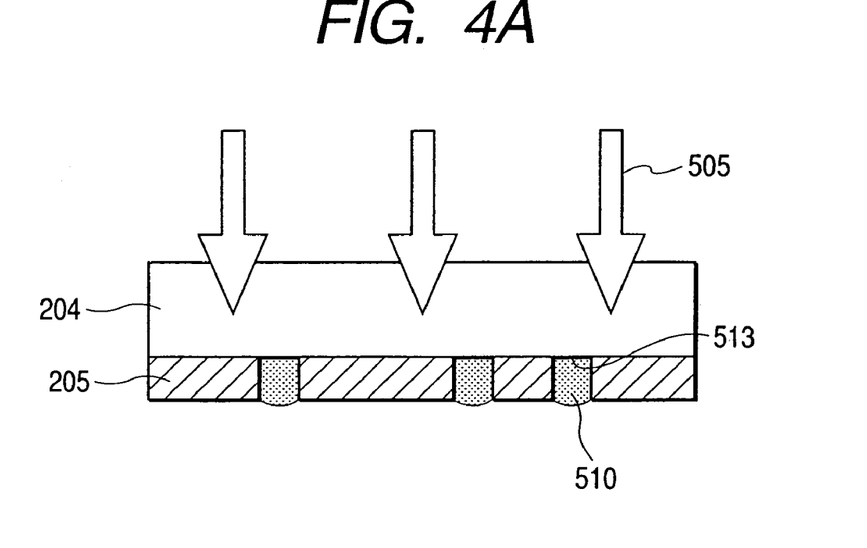
FIGS. 4A and 4B show the reacted photoresist portions for the case where the photoresist film is thick.
Figure 4B:
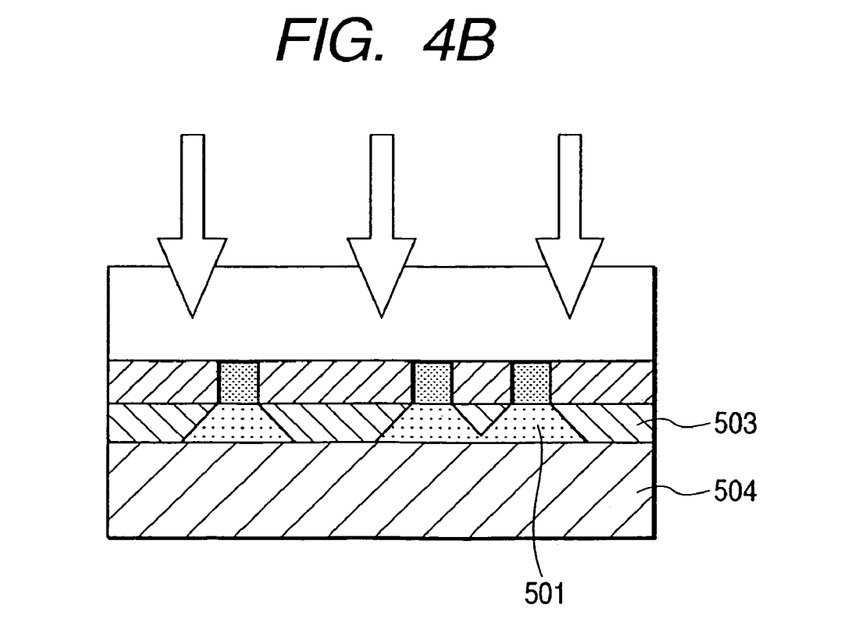

By making the exposure light 505 stream into the photomask having microapertures 513, the near-field light 510 is formed in the neighborhood of a microaperture 513 (FIG. 4A). When the photomask and the photoresist 503 are brought closer together (FIG. 4B), the near-field light 510 is scattered by the photoresist 503 placed on the substrate 504, the reacted photoresist portion 501 is then formed in the photoresist 503. When the photoresist film is thick, the extension of the reacted photoresist portion toward the substrate 504 is enhanced, resulting in the broadening of the fabricable pattern widths. When the intervals of the microapertures are small, the reacted photoresist portions resulting from these apertures overlap each other, providing a much broader line width of the formed pattern. Accordingly, an embodiment with large photoresist-film thickness can not make the best use of the merit of the near-field exposure. In order to take advantage of the merit of the near-field exposure, the film thickness of the photoresist is desirably smaller than the mask aperture diameter which provides near-field light.

Since the lithography using near-field light aims at such micropattern formation that cannot be obtained by the conventional methods, in general the smallest dimension of the mask aperture is not more than 100 nm. Accordingly, the film thickness of the photoresist should be not more than 100 nm.

With such a small film thickness, however, pattern shapes after the exposure and development of the photoresist tend to be nonuniform. In other words, the edges of the patterns do not follow the prescribed lines or curves but have irregularities. The irregularities, that is, the pattern edge roughness is due to the photoresist remaining as aggregates of the order of 10 μm in diameter after development. They adversely affect the dimensional accuracy in the patterns finer than 100 nm to cause problems.

The present inventors used the above-mentioned commercial g-line positive photoresist to conduct the near-field exposure to make the patterns of 200 nm in pitch and 70 nm in line width with the exposure light at 442 nm wavelength, and observed the sectional shapes by a SEM to find that the pattern edge roughness was large and in addition the rectangularity was poor, which rectangularity will be explained below.

In general, it can be said that the magnitude of the pattern edge roughness acceptable in device fabrication is 10% of the pattern width, while there occurs fierce pattern edge roughness in the patterns made as mentioned above, possibly giving rise to adverse consequences in device fabrication.

By the way, the pattern edge roughness concerned is defined in terms of dispersion of the widths of the fabricated patterns as follows.

(Pattern edge roughness)={(maximum width for the fabricated patterns)−(minimum width for the fabricated patterns)}/(assumed pattern width)

For instance, when the widths of the patterns fabricated with the assumed pattern width of 1 μm spread from 0.9 μm to 1.1 μm in difference, the pattern edge roughness amounts to (1.1−0.9)/1=0.2

From the above equation, the pertinent pattern edge roughness is found to be 20%. The pattern edge roughness was 50% for the above-mentioned fabrication of the patterns having a line width of 70 nm.

In addition, in the present proposal, as a method for numerically representing the precision of the fabricated patterns, the "rectangularity" quantity is defined as follows:

(Rectangularity)={(assumed pattern width)−(magnitude of the "shear droop" in a fabricated pattern)}/(assumed pattern width)

Figure 6:
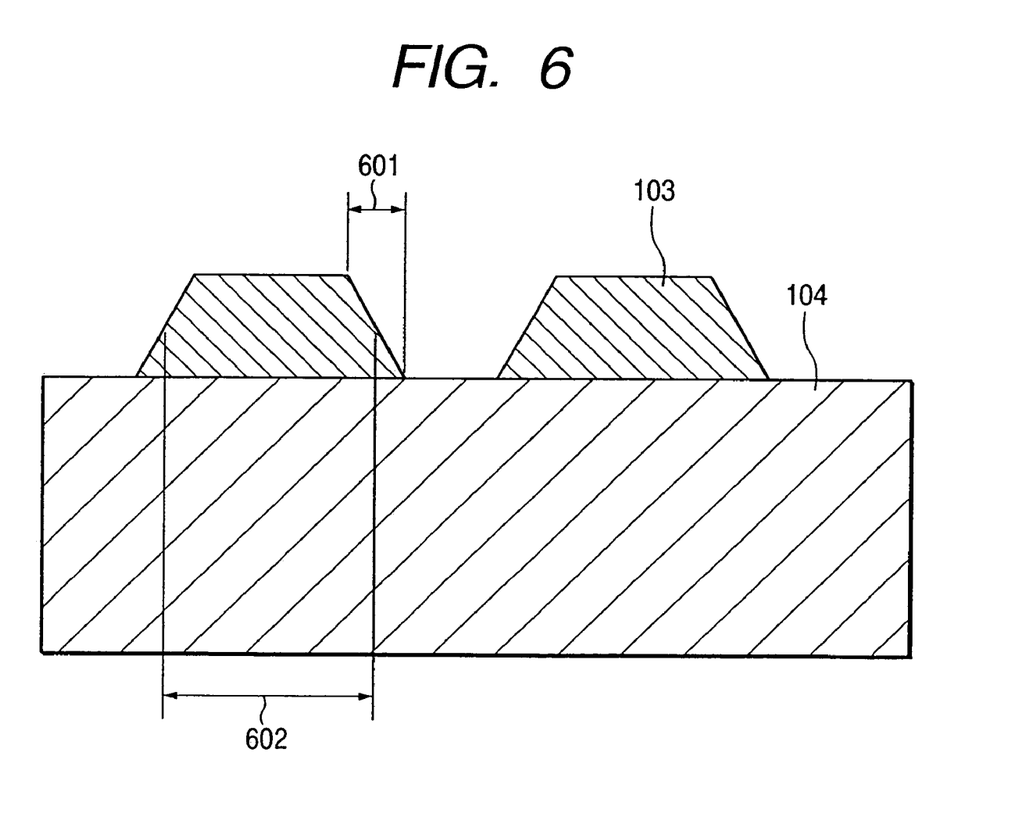
FIG. 6 represents the rectangularity.

For instance, for such patterns as shown in FIG. 6, the assumed pattern width 602 is 100 nm, the magnitude 601 of the shear droop of the fabricated patterns is 20 nm, resulting in a rectangularity of 0.8, that is, 80%. In FIG. 6, reference numeral 103 denotes a photoresist and 104 denotes a substrate.

The rectangularity was found to be 50% for the above-mentioned fabrication of the patterns having the line width of 70 nm.

In the present proposal, the object is to fabricate patterns with the rectangularities not lower than 80%. With the rectangularity lower than 80%, the subsequent process tolerance is diminished, resulting in the throughput lowering and cost rising with a high degree of likelihood.

Efficiency for light utilization in the near-field exposure will be explained below.

The absorption coefficient α ($\mu m^{-1}$) of the photoresist measured by the present inventors with a laser of the 442 nm wavelength was 0.08, which photoresist is a g-line positive photoresist commercially available and assumed to be used in the exposure processing of a film of about 1 μm in thickness and the minimum pattern width of about 450 nm, by use of a stepper and an aligner.

Accordingly, when the photoresist is applied to the substrate so as to make a film of 1 μm in thickness, the transmittance of the resulting film is 92%. When the same photoresist is applied to the substrate so as to make a film of 100 nm in thickness, the transmittance of the resulting film is 99%.

A large amount of transmitted light means that most part of the light transmits through the photoresist layer without being absorbed, resulting in boosting the possibilities that the rectangularity is deteriorated due to the perturbation of the pattern side wall shape by the reflected light from the photoresist-applied substrate, the pattern edge roughness is enhanced, and the like.

Thus, the use of the commercial g-line and i-line photoresists, as they are, which match to the pattern formation methods such as the reduction-projection exposure method in which imaging is made by means of lenses and patterns are formed on photoresist films having a film thickness of the order of 1 μm, etc., results in a low "efficiency for light utilization" in the near-field exposure. As mentioned above, since the light passes through the microaperture of a probe resulting in a significantly reduced light transmittance, and furthermore only about 1% of the transmitted light contributes to the exposure, a ratio of the light contributing to the exposure to the incident light is very small. Furthermore, there is a fault that there occurs such fierce pattern edge roughness that gives adverse results in device fabrication.

In particular, in the present specification, the degree of contribution to exposure of the near-field light generated by the microaperture, that is, the degree in which the exposure making the photosensitive compound in the photoresist cause the photochemical reaction is referred to as the degree of the "efficiency for light utilization" of the exposure light.

SUMMARY OF THE INVENTION

The object of the present invention is to provide a positive photoresist which can solve the above-mentioned problems occurring in the prior art, can achieve a high light utilization efficiency even with a small layer thickness of the photoresist layer for image formation, and can diminish the pattern edge roughness through improving the pattern rectangularity by reducing the reflection from the substrate, and to provide a photolithography method wherein the photoresist layer for image formation formed of said positive photoresist is exposed by means of the near-field exposure.

The present invention which solves the above-mentioned problems is identified by the following items.

(1) A photoresist comprising an alkali-soluble novolak resin and a photosensitive compound having a naphthoquinone diazide group wherein the film thickness of the photoresist at the time of exposure is not larger than 100 nm, and the absorption coefficient α ($\mu m^{-1}$) of the photoresist for the exposure light is:

$0.5 \leq \alpha \leq 7$ (2) The photoresist as set forth in (1) wherein 30 to 150 parts by weight of the photosensitive compound per 100 parts by weight of the alkali-soluble novolak resin is contained.

(3) The photoresist as set forth in (1) wherein the average number of a photosensitive group in a molecule of the photosensitive compound is not smaller than 3.

(4) The photoresist as set forth in (1) to (3) wherein the GPC (gel permeation chromatography) chart pattern area for the components of the alkali-soluble novolak resin having a molecular weight not smaller than 100,000 as reduced to the standard polystyrene is less than 1% of the total area.

(5) The photoresist as set forth in (4) wherein the weight-average molecular weight of the alkali-soluble novolak resin falls in the range of from 500 to 20,000.

(6) The photoresist as set forth in (4) and (5) wherein the molecular weight distribution (Mw/Mn) of the alkali-soluble novolak resin is not larger than 3.

(7) The photoresist as set forth in (1) to (6) wherein the photoresist contains Si.

(8) A photolithography method wherein the photolithography method includes a step of forming a photoresist layer for image formation by use of the photoresists as set forth in any one of (1) to (7), exposing the formed photoresist layer by means of near-field exposure, and transferring the pattern formed on the photoresist layer onto the substrate.

(9) The photolithography method as set forth in (8) wherein a buffer layer is arranged between the substrate to be processed and the photoresist layer for image formation.

(10) A method for producing the photoresist as set forth in (1) which method comprises:

either a process for adjusting the amount of the photosensitive compound in the alkali-soluble novolak resin; or a process for adjusting the average number of the photosensitive groups in a molecule of the photosensitive compound; or both thereof.

DETAILED DESCRIPTION OF THE PREFERRED EMBODIMENTS

The present invention will be described in detail below.

The alkali-soluble novolak resin used in the present invention can be prepared by condensing a phenol with an aldehyde in the presence of an acid catalyst to synthesize an alkali-soluble novolak resin, dissolving the thus synthesized alkali-soluble novolak resin in a polar solvent, for example, an alcohol such as methanol, ethanol, etc., a ketone such as acetone, methylethyl ketone, etc., a cyclic ether such as dioxane, tetrahydrofuran, etc., and the like, and then putting it either in a water-polar solvent mixture system or in a nonpolar solvent such as pentane, hexane, etc., to precipitate the resin portion. In addition, alternatively, the condensation of a phenol with an aldehyde can be controlled to prepare the alkali-soluble novolak resin, by adding the aldehyde either batchwise or continuously when the phenol is reacted with the aldehyde.

As the phenols used in the synthesis of the alkali-soluble novolak resin employed in the present invention, there can be listed phenol, m-cresol, p-cresol, o-cresol, xylenols such as 2,5-xylenol and 3,5-xylenol, m-ethylphenol, p-ethylphenol, o-ethylphenol, 2,3,5-trimethylphenol, butylphenol, hydroquinone, dihydroxydiphenylpropane trimethylphenol, propylphenol, dihydroxybenzene, etc. The phenols can be used independently or as a mixture of more than one thereof.

As the specific examples of the aldehydes used in the synthesis of the alkali-soluble novolak resin employed in the present invention, there can be listed formaldehyde, paraformaldehyde, acetaldehyde, benzaldehyde, phenylacetoaldehyde, furfural, etc.

As the acid catalysts used in the synthesis of the alkali-soluble novolak resin employed in the present invention, there can be listed hydrochloric acid, sulfuric acid, formic acid, oxalic acid, etc.

The above-mentioned aldehydes can be used in the quantity range of 0.7 to 3 moles per 1 mole of the phenol, depending on the reaction conditions. The used quantities of the above-mentioned acid catalysts in general are in the range of $1 \times 10^{-4}$ to $5 \times 10^{-3}$ mole per 1 mole of the phenol, and the reaction temperature is 10 to 200° C., or preferably 70 to 130° C.

The alkali-soluble novolak resin employed in the present invention may contain a variety of substituents, as far as the alkali solubility is not derogated.

The photosensitive compounds employed in the present invention are those compounds which can be synthesized by the esterification reaction of polyhydroxy compounds with quinone diazide sulfonic acids as photosensitive groups.

As the polyhydroxy compounds, there can be used 2,3,4-trihydroxybenzophenone, 2,3,4'-trihydroxybenzophenone, 2,4,6-trihydroxybenzophenone, 2,3,4,4'-tetrahydroxybenzophenone, etc.

As the quinone diazide sulfonic acids, there are listed benzoquinone-1,2-diazide-4-phosphonic acid and naphthoquinone-1,2-diazidesulfonic acids such as naphthoquinone-1,2-diazide-4-sulfonic acid and naphthoquinone-1,2-diazide-5-sulfonic acid.

The rates of the esterifications of the polyhydroxy compounds with the quinone diazide sulfonic acids can be controlled by their molar mixing ratios. The esterification rates affect the average numbers of the photosensitive groups in a molecule of the photosensitive compounds, and hence the desirable average numbers of the photosensitive groups can be obtained by adjusting the molar mixing ratios.

To be more precise, depending on how many sites reacting with the quinone diazide sulfonic acid are in the polyhydroxy compound, the average number of the photosensitive groups in a photosensitive compound molecule is not more than and close to 1 (less than 1 due to the unreacted reactants and other products) by reacting 1 mole of a quinone diazide sulfonic acid with 1 mole of a polyhydroxy compound. Similarly, by reacting 2 moles of a quinone diazide sulfonic acid with 1 mole of a polyhydroxy compound, the average number of the photosensitive groups is not more than and close to 2, while by reacting 3 moles of a quinone diazide sulfonic acid, the average number of the photosensitive groups is not more than and close to 3 if the number of the reaction sites is equal to or larger than 3.

The photoresist of the present invention is prepared by dissolving in a solvent the alkali-soluble novolak polymer and the photosensitive compound prepared by the above-mentioned methods. The amount of the photosensitive component is so adjusted that the absorption coefficient α ($\mu m^{-1}$) of the photoresist for the exposure light satisfies the relation:

$$0.5 \leq \alpha \leq 7,$$

or more preferably satisfies the relation:

$$1 \leq \alpha \leq 5$$

When the absorption coefficient α is less than 0.5 (This value corresponds to the 95% transmittance in the case of the 100 nm film thickness of the applied photoresist), the transmitted amount of light for the exposure light with the film thickness of the formed photoresist layer not larger than 100 nm becomes large, and the reflection from the substrate is increased to cause the deterioration of the rectangularity and the occurrence of the line edge roughness.

When the absorption coefficient is larger than 7 (This value corresponds to the 50% transmission in the case of the 100 nm film thickness of the applied photoresist), the degree of absorption in the film thickness direction is increased, and hence the patterns are formed by exposure in the upper and middle portions of the photoresist layer, but it takes a long time for exposure to develop the patterns to the bottom portion of the photoresist, presumably resulting in the throughput lowering.

As a method for preparing a photoresist in which the absorption coefficient α ($\mu m^{-1}$) satisfies the relation, $0.5 \leq \alpha \leq 7$, there are a method in which the amount of the photosensitive groups in a photosensitive compound molecule is adjusted, and a method in which the amount of the photosensitive compound in the photoresist is adjusted, while the amount of the photosensitive groups in a photosensitive compound molecule has a limit concerning the increase in the amount of the photosensitive groups. For instance, when a hydroxybenzophenone is used as a skeleton of the photosensitive compound, the conditions for the synthesis of a hexa compound having 6 sites reactive with the photosensitive group are so severe that the synthesis cost is increased and the throughput is lowered. As for the synthesis of the fully esterified compound in which all the photosensitive groups are esterified for all the 6 reactive sites of hexahydroxybenzophenone, the synthesis conditions are furthermore severe, resulting in much more cost rising and throughput lowering.

With increasing amount of the photosensitive compound in the photoresist, the photosensitive compound tends to be separated out, so that the photoresist tends to be inappropriate for preservation with increasing probability.

By making the absorption coefficient α to satisfy the relation, $0.5 \leq \alpha \leq 7$, the transmittance can be made smaller than the case where the photoresist is used, as it is, with the film thickness not larger than 100 nm, which photoresist is prepared by assuming the prescribed film thickness of the order of 1 µm to several 100 nm. Where the transmittance is small, the light utilization efficiency is raised owing to the fact that the light amount of the light which entirely or partly contributes to the photochemical reaction of the photosensitive compound is increased, and the pattern-shape rectangularity is improved and the pattern edge roughness is reduced owing to the reduced reflection from the substrate. Furthermore, the difference between the exposed and unexposed portions in the photoresist in rates of dissolution in the alkaline developing solution is increased to yield the enhanced contrast, and accordingly there is obtained the effect that the rectangularity of the sectional pattern shape of the photoresist is improved.

In order to adjust the photoresist absorptivity to the above-mentioned range, the amount of the photosensitive compound may be made to fall within the range of 30 to 150 parts by weight per 100 parts by weight of the alkali-soluble novolak resin.

With the less than 30 parts by weight of the photosensitive compound, the transmittance of the exposure light is too high to yield the advantage that the rectangularity, resolution, and light utilization efficiency are improved as compared to the conventional photoresists. The use of the more than 150 parts by weight of the photosensitive compound is not realistic in terms of throughput, since with such high parts by weight no further improvement of the above-mentioned advantage is achieved, and it takes a very long exposure time to decompose the photosensitive compound thoroughly with no remaining residuals.

Further, the transmittance of the photoresist may be adjusted to the above values by making the average number of the photosensitive groups in a molecule of the photosensitive compound not to be smaller than 3.

Although it is sufficient in the above method for the absorption coefficient to satisfy the condition that it is not smaller than 0.5 and not larger than 7, it is preferable for the average number of the photosensitive groups in a molecule of the photosensitive compound to fall in the range of 3 to 5, and furthermore for the amount of the photosensitive compound to fall in the range of 50 to 130 parts by weight per 100 parts by weight of the novolak resin, in view of the cost, throughput, and preservability, depending on the skeletal structure of the photosensitive compound, the photosensitive group, and the combinations thereof.

The magnitude of the pattern edge roughness acceptable in fabrication of devices is said to be 10% of the pattern width. Since a cause for the pattern edge roughness is assumed to be the grain diameter of the photoresist aggregate, the grain diameter of the photoresist aggregate is required to be not larger than 5 nm, on the basis of the assumed minimum pattern width of 50 nm provided by the near-field exposure.

Factors which determine the grain diameter of the photoresist aggregate are considered to be the molecular weight of the novolak resin used as the base polymer of the photoresist, and entanglement of the base polymers. Thus, it is preferable for the alkali-soluble novolak resin not to have components larger than 100,000 in molecular weight. Where the polymer components larger than 100,000 in molecular weight are present, the grain diameter of the photoresist aggregate which is considered to be a cause for the pattern edge roughness is increased, and the surface quality also tends to be deteriorated.

Furthermore, it is preferable to make the weight-average molecular weight (Mw) of the novolak resin fall in the range of 500 to 20,000. The molecular weight smaller than 500 leads to the poor film-forming performance, while the molecular weight larger than 20,000 leads to the enhanced probability of increasing the grain diameter of the photoresist aggregate which is considered to be a cause for the pattern side wall shape disturbance and large pattern edge roughness that give rise to troubles in device fabrication.

Furthermore, the molecular weight distribution (Mw/Mn; Mn is the number average molecular weight) is preferably not larger than 3. The distribution smaller than 3 reduces the nonuniformity in development which is caused by the nonuniform dissolution rates of the photoresist polymers in the developing solution, which is assumed to be a cause for the pattern edge roughness.

Incidentally, the weight-average molecular weight (Mw) and molecular weight distribution (Mw/Mn) of the alkali-soluble novolak resin can be measured with the gel permeation chromatography (GPC) method using the monodisperse polystyrene as the standard and tetrahydrofuran as solvent with the column temperature of 40° C.

With thick photoresist films, it is impossible to fabricate micropatterns even using the near-field light, as mentioned above. Thus, for fabrication of micropatterns, the thickness of the photoresist film is required to be small.

As for the thickness of the photoresist film, preferably it is about the minimum aperture used in exposure. In the case of the pattern formation based on the near-field exposure, the thickness of the photoresist film is set to be not larger than 100 nm because of aiming at the micropattern formation.

When the thickness of the photoresist film set to be about the minimum aperture as mentioned above is too small to provide a sufficient tolerance to dry etching in processing the substrate being processed, the substrate to be processed can be processed by using a multilayer photoresist method wherein a buffer layer is provided between the substrate to be processed and the photoresist substrate for image formation.

As a photoresist for image formation, the photoresist of the present invention may contain Si (silicon atoms). The Si incorporation into the photoresist for image formation makes it possible to reduce one buffer layer when the multilayer photoresist method is used, and hence the process is made convenient so that the throughput is expected to be improved.

The addition of Si-containing compounds can be used as a method for incorporating Si. The Si content is generally 1 to 50 parts by weight per 100 parts by weight of the alkali-soluble novolak resin, and is preferably 15 to 30 parts by weight. With the Si content less than 1 part by weight, no improvement in the dry etching tolerance is expected, as compared to the case of the null Si content. With the Si content more than 50 parts by weight, there occur the reduced exposure sensitivity, the prevented uniform film formation, and the like.

The positive photoresist for the near-field exposure of the present invention, if desired, may contain the alkali-soluble resins other than the alkali-soluble novolak resin, and such additives well known in the art as sensitizer, surfactants, dyes, auxiliary adhesives, preservation stabilizers, antifoaming agents, etc.

Granted that any coating method is acceptable as far as it can achieve the desired layer thickness, uniformity, etc., the application by use of a spin coater is preferred for its versatility.

The layer thickness of the photoresist for image formation can be adjusted, when a spin coater is used, by varying the number of revolutions and the revolution time of the spin coater, and the photoresist viscosity.

When a thin layer is desired, the number of revolutions is increased, the revolution time is extended, and the photoresist viscosity is reduced. Incidentally, the spin coating is preferably performed in a sealed chamber to avoid the case where the preparation of a thin photoresist layer for image formation is forbidden by instant evaporation of the solvent.

By increasing the number of revolutions and extending the revolution time of the spin coater, even with the same photoresist viscosity, the application thickness can be made smaller to some extent. However there is a mechanical limitation in increasing the number of revolutions. As far as an all-purpose spin coater is used, with increasing revolution time the film thickness of the photoresist eventually reaches a plateau, and the throughput is reduced. Thus, it is also preferable to adjust the photoresist viscosity in order to provide a thin photoresist film.

The viscosity of the photoresist of the present invention can be adjusted by adding solvents, which viscosity preferably falls in the range of 1 to 10 cP. A large amount of solvent is necessary to make the photoresist viscosity amount to lower than 1 cP, which is uneconomical. The photoresist viscosity higher than 10 cP requires a heavy mechanical load to the spin coater or a long application time, unpreferably resulting in a reduced throughput.

As the solvent to be used in the viscosity adjustment method based on solvent addition, any solvent can be used which dissolves the alkali-soluble novolak resin and the photosensitive quinone diazide compound as the photosensitive compound. From the viewpoint of safety, however, PGMEA (propylene glycol monomethyl ether acetate), ethyl lactate, butyl acetate, 2-heptane, etc. are preferably used independently, or as mixtures thereof.

(Exposure and the Subsequent Processes)

The image-forming photoresist layer formed on the substrate to be processed as described above undergoes a probe-scanning exposure using the near-field probe and an en bloc near-field exposure with a photomask.

In the exposure step, since the exposure-light-sensitive wavelength range of the photoresist ranges from about 200 to 500 nm, a laser with a wavelength of 200 to 500 nm or a lamp such as a mercury-arc lamp, etc. operative in this range is needed to be used as an exposure light source. There may be used such a light source as a He—Cd laser with the wavelengths of 442 nm and 325 nm, a GaN type blue semiconductor laser with the wavelengths near 410 nm, or an infrared laser in the second or third haromic generation (SHG or THG) mode. In particular, the use of a blue semiconductor laser recently put into practical use has an effect to make the apparatus extraordinarily compact.

The development is made subsequently to the exposure step. The development can be performed according to the methods well known in the art. The substrate to be processed provided with the photoresist micropatterns thus fabricated can be processed by etching, metal vapor deposition, lift off, etc., to yield a finished product.

The following comparative examples and examples will illustrate the present invention in detail. As illustrated in the following, concerning the fabrication of the micropatterns by means of the near-field exposure, the present invention can provide a positive photoresist for the near-field exposure wherein the efficiency for light utilization for exposure light is high, the rectangularity in the pattern sectional shape is excellent, and the pattern edge roughness is reduced. Moreover, the present invention can provide a photolithography method, inclusive of the exposure process based on the near-field exposure, wherein the efficiency for light utilization is high, the pattern rectangularity is excellent and the pattern edge roughness is reduced.

COMPARATIVE EXAMPLE 1

A photoresist solvent PGMEA was added to the commercial photoresist for semiconductor production containing 20 parts by weight of a photosensitive compound (naphthoquinone diazide type compound) per 100 parts by weight of the alkali-soluble novolak resin as photoresist base resin, to obtain a photoresist having a viscosity of 5 cP.

The photoresist was applied to the surface of a glass substrate subjected to the surface treatment by coating with HMDS (hexamethyldisilazane) so as to obtain a photoresist film of 100 nm in thickness, and the transmittance of the glass substrate was measured and found to be 99%, corresponding to the absorption coefficient of 0.08.

A substrate is spin-coated with the above-mentioned photoresist in a sealed space. A glass substrate 101 having a deposited Cr layer 102 of 30 nm in thickness was used as the substrate (see FIG. 1A). Under the spin-coating condition of 7,000 rpm×60 sec, the film thickness of the obtained photoresist 103 was about 50 nm.

Figure 1A:
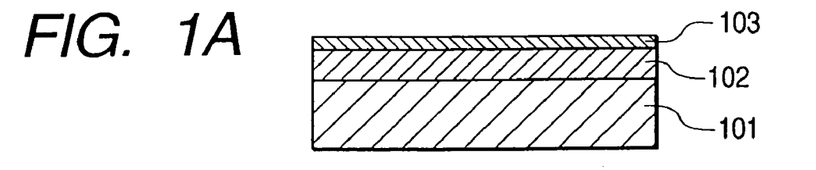
FIGS. 1A, 1B, 1C and 1D are the block diagrams outlining the photolithography method described in Example 1 of the present invention.
Figure 1B:
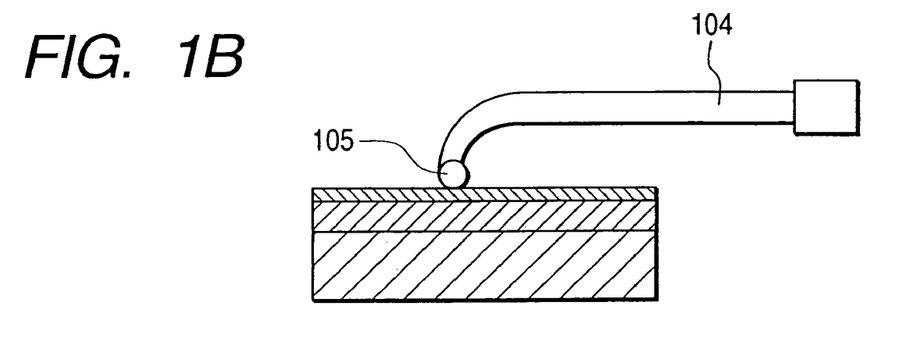

The photoresist coated substrate underwent exposure by use of a probe-scanning near-field exposure apparatus (FIG. 1B). By using a probe 104 of 50 nm in tip aperture diameter and making an incident light of 430 nm in wavelength stream into the probe, the photoresist patterns having the widths of the order of 100 nm (FIG. 1C) was formed at the near-field 105 formed at the probe tip.

For the photoresist patterns, the rectangularity was measured and found to be as poor as 50%, and the pattern widths were measured to have a not smaller than 50 nm maximum-minimum difference which is 50% or more of the pattern width to result in a large pattern edge roughness.

EXAMPLE 1

The diazide compound containing a photosensitive compound 1,2-naphthoquinone diazide-5-sulfonic acid ester as the main component in an amount corresponding to 80 parts by weight per 100 parts by weight of a photoresist base resin (alkali-soluble novolak resin) and PGMEA as solvent were added to a commercial positive photoresist for semiconductor production containing 30 parts by weight of a photosensitive compound (naphthoquinone diazide) per 100 parts by weight of the photoresist base resin, and the resultant was mixed to prepare a positive photoresist for near-field exposure having a viscosity of 5 cP. The absorption coefficient of the photoresist was measured and found to be 1.0.

A substrate was spin-coated with the positive photoresist for near-field exposure in a sealed space to form a photoresist layer for image formation.

A glass substrate 101 having a deposited Cr layer 102 of 30 nm in thickness was used as the substrate (see FIG. 1A). Then the Cr layer was spin-coated with the above-mentioned photoresist under the spin-coating condition of 7,000 rpm× 60 sec. The film thickness of the photoresist layer 103 for image formation was measured by using a film thickness measurement apparatus (α-STEP500, Tencor Corp.) and found to be about 50 nm.

Figure 1C:
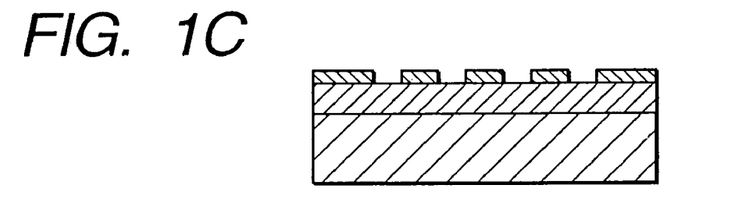

The photoresist layer 103 for image formation underwent exposure by use of a probe-scanning near-field exposure apparatus (FIG. 1B). Using a probe 104 of 50 nm in tip aperture diameter and making an incident light of 430 nm in wavelength stream into the probe, the exposure was made with the near-field 105 formed at the probe tip. The development was performed with an alkaline developing solution to form the photoresist patterns having a minimum pattern width of 50 nm (FIG. 1C). The formed photoresist patterns were observed with an AFM (atomic force microscope) and a SEM (scanning electron microscope) and the pattern edge roughness was found to be not larger than 10% of the minimum pattern line width; with the absorbance raised to 1.0, the rectangularity was improved and the pattern edge roughness was reduced.

Although an amount of the photosensitive compound was increased, with the same probe scanning rate as in Comparative Example 1, the photoresist patterns having a minimum pattern size of 50 nm and a small pattern edge roughness could be formed. This may be ascribable to the increased fraction of the incident light contribution to the reaction of the photosensitive compound, and hence the light utilization efficiency can be said to be improved.

Figure 1D:
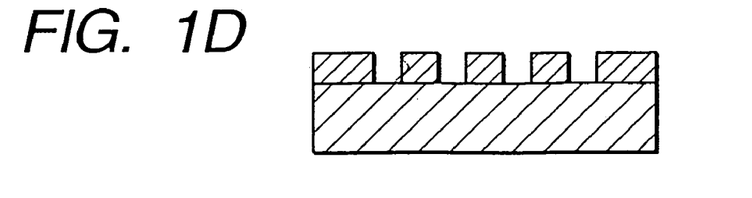

With the formed photoresist patterns as the master patterns, wet etching was made on the Cr layer to transfer the patterns with the minimum line width of 50 nm (FIG. 1D).

EXAMPLE 2

The diazide compound containing a photosensitive compound 1,2-naphthoquinone diazide-5-sulfonic acid ester as the main component in an amount corresponding to 80 parts by weight per 100 parts by weight of the alkali-soluble novolak resin as a base resin (molecular weight distribution (Mw/Mn) is 2.5) was added to a photoresist containing 30 parts by weight of a photosensitive compound (naphthoquinone diazide) per 100 parts by weight of the base resin, and further GPMEA as solvent was added thereto, and the resultant was mixed to prepare a positive photoresist for near-field exposure having a viscosity of 5 cP. The absorption coefficient of the photoresist was measured and found to be 1.0.

A substrate was spin-coated with the positive photoresist for near-field exposure under the spin-coating condition 7,000 rpm×60 sec in a sealed space to form a photoresist layer for image formation. An SOI (Silicon On Insulator) substrate 201 having an upper Si layer 202 of 50 nm in thickness was used as the substrate. The film thickness of the photoresist layer 203 for image formation was measured by using a film thickness measurement apparatus (α-STEP500, Tencor Corp.) and found to be about 50 nm (FIG. 2A).

Figure 2A:
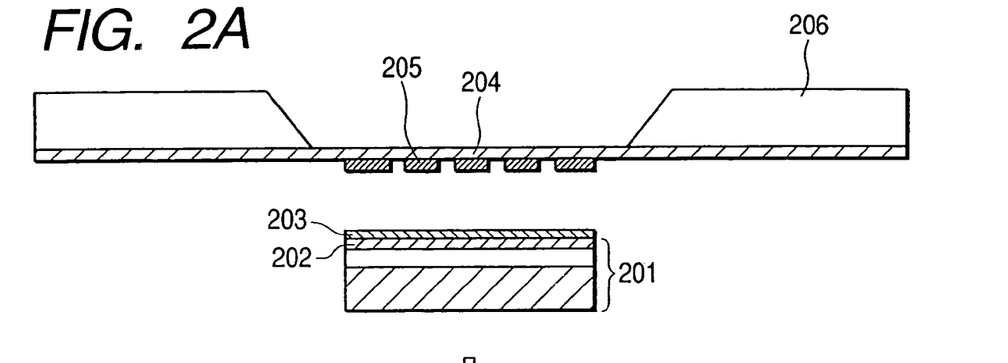
FIGS. 2A, 2B, 2C and 2D are block diagrams schematically showing the photolithography method described in Examples 2 and 5 of the present invention.
Figure 2B:
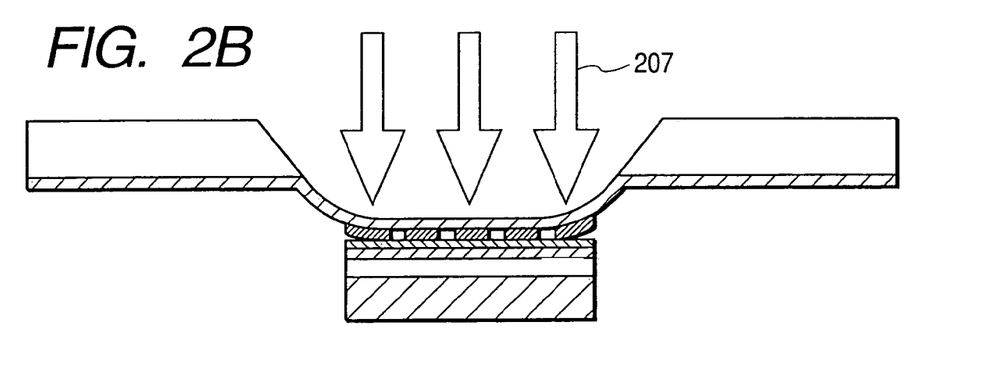
Figure 2C:
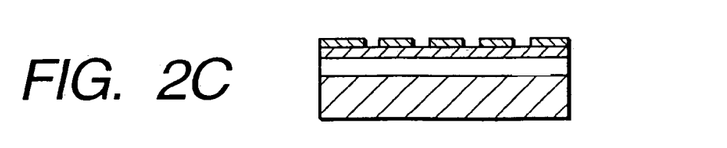

The photoresist layer 203 for image formation was exposed by near-field light from a photomask using an en bloc exposure apparatus (FIG. 2A). The photomask used consisted of the microapertures and light shielding films 205 formed by the FIB (Focused Ion Beam) fabrication in a Cr layer deposited on a mask base 204 comprising a SiN thin film supported with a support 206. While the photomask was set close to the surface of the photoresist layer for image formation on the substrate, the exposure was performed by making the incident light 207 from a Hg lamp stream onto the surface (FIG. 2B), and the photoresist patterns with the minimum line width of 50 nm could be formed by development treatment using an alkaline developing solution (FIG. 2C). The formed patterns were observed with an AFM and a SEM, and the rectangularity was found to be 80% and the pattern edge roughness was found to be not larger than 10% of the minimum pattern line width. Since the pattern edge roughness defined in the present specification is such that it is determined by the maximum and minimum line widths of the formed patterns, the roughness numerical values do not immediately represent the relevant distribution, the dispersive distribution of the pattern widths is contracted as compared with Example 1. This may be ascribed to the molecular weight distribution of the novolak resin adjusted to 2.5.

Figure 2D:
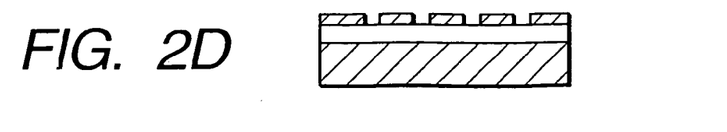

With the formed photoresist patterns as the master patterns, dry etching was made with $SF_6$ gas on the upper Si layer 202 to transfer the pattern having a minimum line width of 50 nm onto the Si layer 202 on the insulating film (FIG. 2D).

EXAMPLE 3

The diazide compound containing a photosensitive compound 1,2-naphthoquinone diazide-5-sulfonic acid ester as the main component in an amount corresponding to 80 parts by weight per 100 parts by weight of a base resin (alkali-soluble novolak resin) was added to a commercial Si-containing photoresist for semiconductor production including 15 parts by weight of a photosensitive compound (naphthoquinone diazide) per 100 parts by weight of the base resin and further GPMEA as solvent was added thereto, and the resultant was mixed to prepare a positive photoresist for near-field exposure having a viscosity of 5 cP. The absorption coefficient of the photoresist was measured and found to be 1.0.

An SOI (Silicon On Insulator) substrate 303 having an upper Si layer of 300 nm in thickness was used as the substrate. In order to apply the multilayer photoresist method, a commercial positive photoresist was applied to the upper Si layer by using a spin coater, and then the substrate was hard-baked at 200° C. for 30 min, to form a buffer layer (hereafter, described as a thick-film photoresist as the case may be) 301 of 0.5 μm in thickness.

Figure 3A:
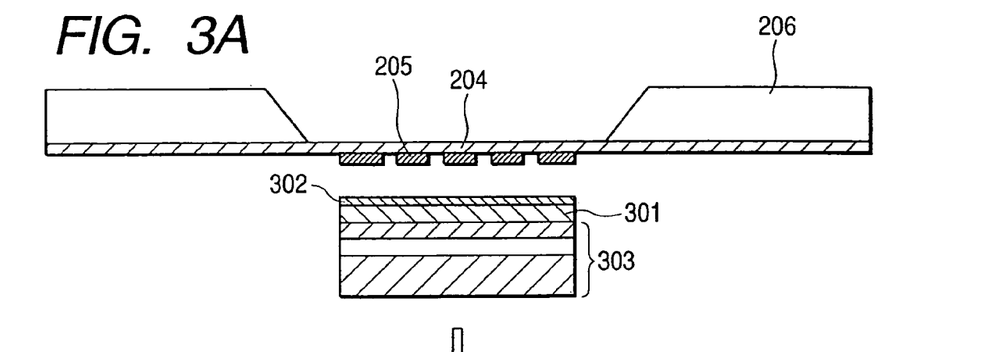
FIGS. 3A, 3B, 3C, 3D and 3E are the block diagrams schematically showing the photolithography method described in Example 3 of the present invention.

Furthermore, the buffer layer was spin-coated thereon to form a photoresist layer 302 for image formation, under the spin-coating condition of 7,000 rpm×60 sec. The layer thickness of the photoresist layer 302 for image formation was measured by using a film thickness measurement apparatus (α-STEP500, Tencor Corp.) and found to be about 30 nm (FIG. 3A).

Figure 3B:
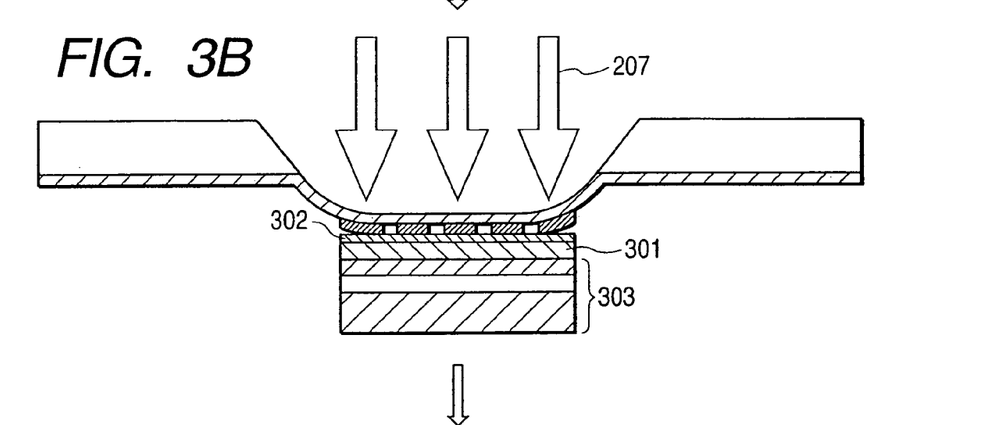
Figure 3C:
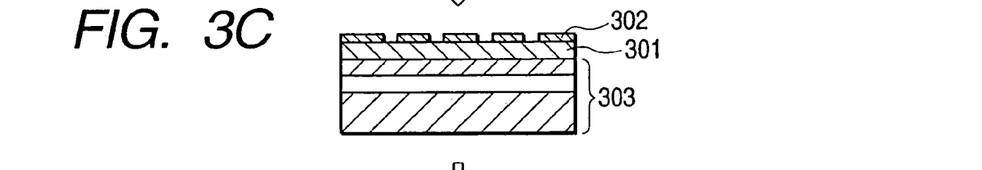

The photoresist layer 302 for image formation was exposed by near-field light from a photomask using an en bloc exposure apparatus. The photomask used consisted of the microapertures and light shielding films 205 formed by the FIB fabrication in a Cr layer deposited on a mask base 204 comprising a SiN thin film supported with a support 206. While the photomask was set close to the surface of the photoresist layer for image formation on the substrate, the exposure was performed by making the incident light 207 from a Hg lamp stream onto the surface (FIG. 3B), and the photoresist pattern with the minimum pattern line width of 50 nm could be formed by development treatment using an alkaline developing solution (FIG. 3C). The formed pattern was observed with an AFM and a SEM, and the pattern edge roughness was found to be not larger than 10% of the minimum pattern line width.

Figure 3D:
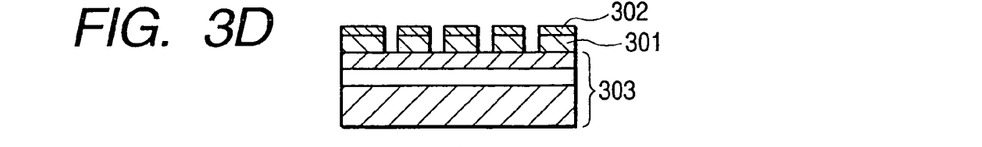
Figure 3E:
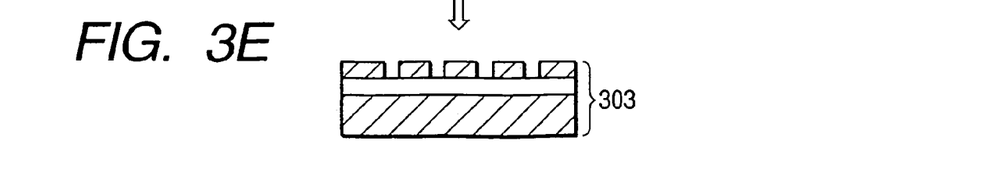

With the formed photoresist patterns as the master patterns, dry etching was made with $O_2$ gas to transfer the upper most layer photoresist patterns onto the thick-film photoresist (FIG. 3D). With the thus formed thick-film patterns as the master patterns, dry etching was made with $SF_6$ gas on the upper Si layer to transfer the patterns having a minimum pattern line width of 50 nm onto the upper Si layer on the insulating film (FIG. 3E).

Since the increased absorption coefficient of the Si containing photoresist made it possible to transfer the micropatterns to the thick-film photoresist, the substrate fabrication process tolerance could be extended, so that the Si on the insulator could be processed.

EXAMPLE 4

A mixture of m-cresol and p-cresol in molar ratio 4:6 was prepared, formalin was added to this mixture, and the condensation polymerization was carried out according to the usual condensation method using the oxalic acid catalyst, wherein a novolak resin was obtained.

On the other hand, 2,3,4,4'-tetrahydroxybenzophenone and 1,2-naphthoquinone diazide-5-sulfonyl chloride in the amount corresponding to 90 mole % of the —OH groups of the benzophenone were dissolved in dioxane, and triethyl amine was added to this solution and esterification was performed to yield a photosensitive compound. The average number of the photosensitive groups of the photosensitive compound falls in the range of 3 to 4 per a molecule. 100 parts by weight of the novolak resin and 30 parts by weight of the photosensitive compound were dissolved and mixed in PGMEA as solvent, and then the solution was filtered with a Teflon (trade name) filter of 0.1 μm. PGMEA was added to the filtrate to adjust the viscosity of the filtrate to be 5 cP, to prepare a positive photoresist for the near-field exposure. A film of 100 nm in thickness prepared by applying the thus prepared photoresist exhibited a 90% transmittance for the exposure light, corresponding to an absorption coefficient of 1.1.

Figure 5A:
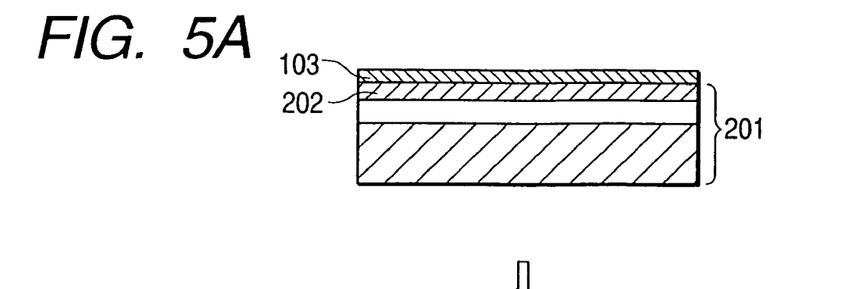
FIGS. 5A, 5B, 5C and 5D are the block diagrams schematically showing the photolithography method described in Example 4 of the present invention.

Then, a photoresist layer for image formation was formed by spin-coating the substrate with the photoresist in a sealed space, under the spin-coating condition 7,000 rpm×60 sec. An SOI (Silicon On Insulator) substrate 201 having an upper Si layer 202 of 50 nm in thickness was used as the substrate (FIG. 5A). The layer thickness of the photoresist layer 103 for image formation was measured by using a film thickness measurement apparatus (α-STEP500, Tencor Corp.) and found to be about 50 nm.

Figure 5B:
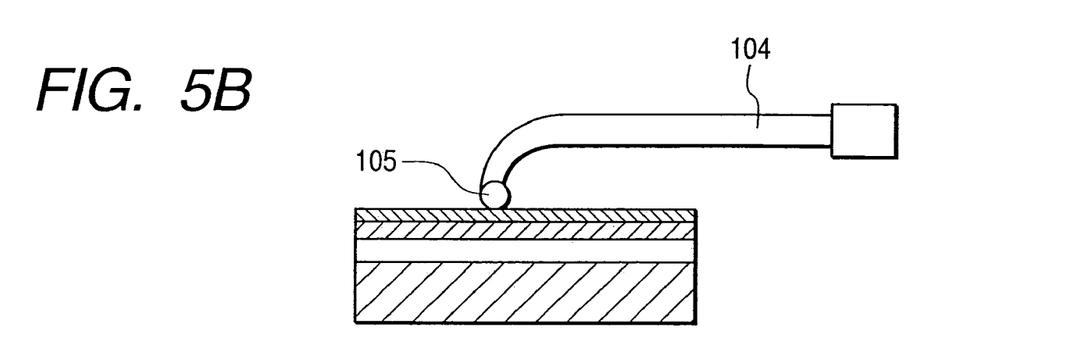
Figure 5C:
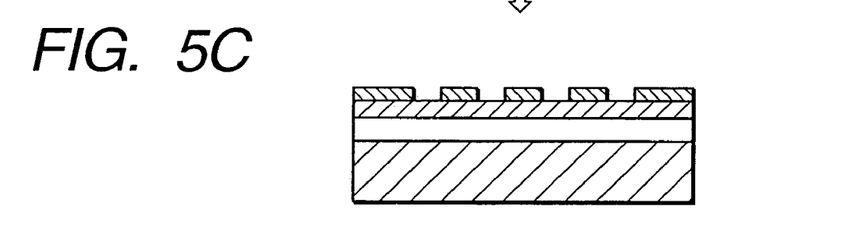

The photoresist layer 103 for image formation underwent exposure by use of a probe-scanning type near-field exposure apparatus (FIG. 5B). Using a probe 104 of 50 nm in tip aperture diameter and making an incident light of 430 nm in wavelength stream into the probe, the exposure was made with the near-field 105 formed at the probe tip. The development was performed with an alkaline developing solution to form the photoresist patterns having a minimum pattern width of 50 nm (FIG. 5C). The formed photoresist patterns were observed with an AFM (atomic force microscope) and a SEM (scanning electron microscope) and the pattern edge roughness was found to be not larger than 10% of the minimum pattern line width, and the rectangularity was found to be 80% in the sectional shape, achieving an improvement as compared with Comparative Example 1.

Consequently, there were formed the photoresist patterns in which the minimum pattern size was 50 nm and the pattern edge roughness was small. This may be ascribable to the reduction of the reflection from the Si layer 202 caused by the increased average number of the photosensitive groups in a molecule of the photosensitive compound, eventually resulting in the reduced pattern edge roughness. Since the transmittance was decreased as compared with the case where a commercial photoresist was employed for the near-field exposure, it can be said that the incident light amount contributing to the reaction of the photosensitive compound was increased, and hence the light utilization efficiency was improved. It also can be said that the difference between the exposed and unexposed portions in solubility to the developing solution was increased due to the increased number of the photosensitive groups, leading to the improved rectangularity of the pattern sectional shape.

Figure 5D:
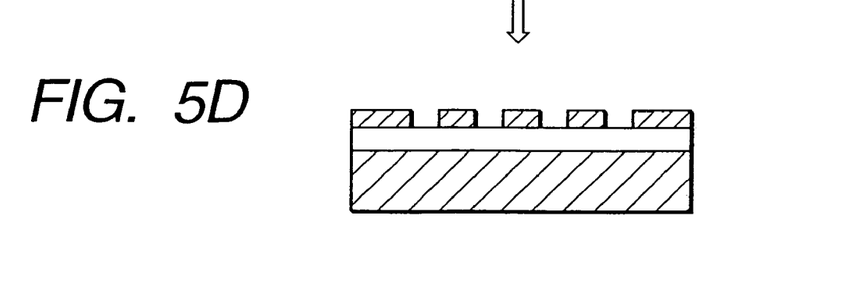

With the formed photoresist patterns as the master patterns, wet etching was made on the Si layer 202 to transfer the pattern with the minimum line width of 50 nm (FIG. 5D).

EXAMPLE 5

A mixture of m-cresol and p-cresol in molar ratio 4:6 was prepared, formalin was added to this mixture, and the condensation polymerization was carried out according to the usual condensation method using the oxalic acid catalyst, whereby a novolak resin was obtained. The novolak resin was subjected to the fractionation treatment, whereby the low molecular weight portion was discarded to prepare the novolak resin having the weight-average molecular weight of 3,500.

On the other hand, 2,3,4,4'-tetrahydroxybenzophenone and 1,2-naphthoquinone diazide-5-sulfonyl chloride in the amount corresponding to 90 mole % of the —OH groups of the benzophenone were dissolved in dioxane, and triethyl amine was added to this solution and esterification was performed to yield a photosensitive compound. The average number of the photosensitive groups of the photosensitive compound falls in the range of 3 to 4 per a molecule.

100 parts by weight of the novolak resin and 30 parts by weight of the photosensitive component were dissolved and mixed in PGMEA as solvent, and then the solution was filtered with a Teflon (trade name) filter of 0.1 μm. PGMEA was added to the filtrate to adjust the viscosity of the filtrate to be 5 cP, to prepare a positive photoresist for the near-field exposure. The absorption coefficient of the photoresist was measured and found to be 1.1.

Then, a photoresist layer for image formation was formed by spin-coating the substrate with the positive photoresist for the near-field exposure in a sealed space under the spin-coating condition 7,000 rpm×60 sec. An SOI (Silicon On Insulator) substrate 201 having an upper Si layer 202 of 50 nm in thickness was used as the substrate. The layer thickness of the photoresist layer 203 for image formation was measured by using a film thickness measurement apparatus (α-STEP500, Tencor Corp.) and found to be about 50 nm (FIG. 2A).

The photoresist layer 203 for image formation was exposed by near-field light from the photomask using an en bloc exposure apparatus (FIG. 2A). The photomask used consisted of the microapertures and light shielding films 205 formed by the FIB (Focused Ion Beam) fabrication in a Cr layer deposited on a mask base 204 comprising a SiN thin film supported with a support 206. While the photomask was set close to the surface of the photoresist layer for image formation on the substrate, the exposure was performed by making the incident light 207 from a Hg lamp stream onto the surface (FIG. 2B), and the photoresist patterns with the minimum line width of 50 nm could be formed by development treatment using an alkaline developing solution (FIG. 2C). The formed patterns were observed with an AFM and a SEM, and the pattern rectangularity was found to be 80% and the pattern edge roughness was found to be not larger than 8% of the minimum pattern line width.

The pattern edge roughness was reduced as compared to Example 4, owing to the average molecular weight of the novolak resin specified to be 3,500.

With the formed photoresist patterns as the master patterns, dry etching was made with $SF_6$ gas on the upper Si layer to transfer the pattern having a minimum line width of 50 nm onto the Si layer on the insulating film (FIG. 2D).

EXAMPLE 6

A mixture of m-cresol and p-cresol in molar ratio 4:6 was prepared, formalin was added to this mixture, and the condensation polymerization was carried out according to the usual condensation method using the oxalic acid catalyst, whereby a novolak resin was obtained.

On the other hand, 2,3,4,4'-tetrahydroxybenzophenone and 1,2-naphthoquinone diazide-5-sulfonyl chloride in the amount corresponding to 90 mole % of the —OH groups of the benzophenone were dissolved in dioxane, and triethyl amine was added to this solution and esterification was performed to yield a photosensitive compound. The average number of the photosensitive groups of the photosensitive compound falls in the range of 3 to 4 per a molecule.

100 parts by weight of the novolak resin and 30 parts by weight of the photosensitive component were dissolved and mixed in PGMEA as solvent, and then the solution was filtered with a Teflon (trade name) filter of 0.1 μm. PGMEA was added to the filtrate to adjust the viscosity of the filtrate to be 5 cP, to prepare a positive photoresist for the near-field exposure. The absorption coefficient of the photoresist was measured and found to be 1.1.

An SOI (Silicon On Insulator) substrate 303 having an upper Si layer of 300 nm in thickness was used as the substrate. In order to apply the multilayer photoresist method, a commercial positive photoresist was applied to the upper Si layer by using a spin coater, and then the substrate was hard-baked at 200° C. for 30 min, to form a buffer layer (hereafter, described as a thick-film photoresist as the case may be) 301 of 0.5 μm in thickness.

Figure 7A:
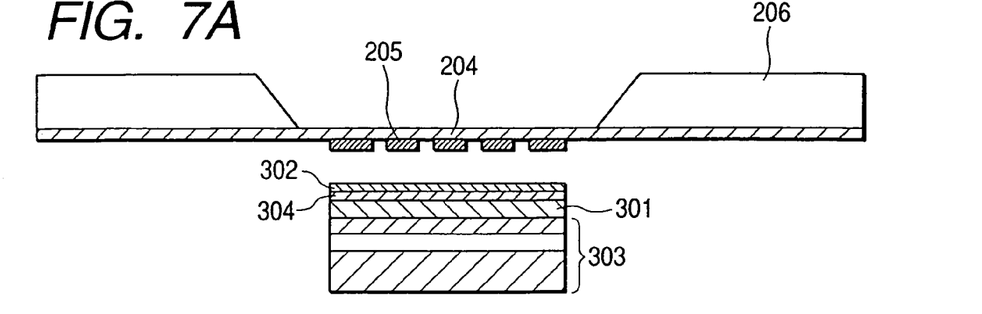
FIGS. 7A, 7B, 7C, 7D and 7E are the block diagrams schematically showing the photolithography method described in Example 6 of the present invention.

An SOG (Spin On Glass) organic-solvent solution was applied to the buffer layer 301, and an oxidized Si thin film of 100 nm in thickness was formed by heating. This is referred to as the SOG layer 304. The SOG layer 304 was spin-coated with the photoresist under the spin-coating condition 7,000 rpm×60 sec, to form a photoresist layer 302 for image formation. The layer thickness of the photoresist layer 302 for image formation was measured by using a film thickness measurement apparatus (α-STEP500, Tencor Corp.) and found to be about 40 nm (FIG. 7A).

Figure 7B:
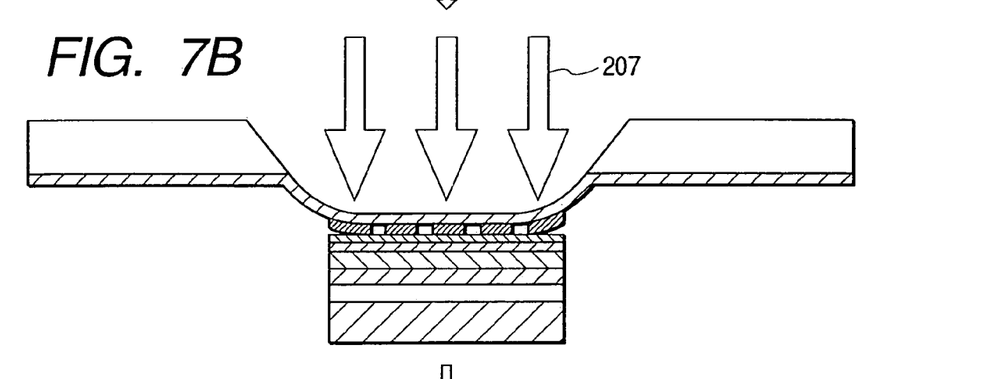
Figure 7C:
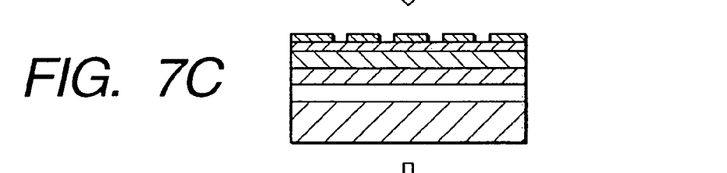

The photoresist layer 302 for image formation was exposed by near-field light from the photomask using an en bloc exposure apparatus. The photomask used consisted of the microapertures and light shielding films 205 formed by the FIB fabrication in a Cr layer deposited on a mask base 204 comprising a SiN thin film supported with a support 206. While the photomask was set close to the surface of the photoresist layer for image formation on the substrate, the exposure was performed by making the incident light 207 from a Hg lamp stream onto the surface (FIG. 7B), and the photoresist patterns with the minimum pattern line width of 50 nm could be formed by development treatment using an alkaline developing solution (FIG. 7C). The formed patterns were observed with an AFM and a SEM, and the pattern rectangularity was found to be 80% and the pattern edge roughness was found to be not larger than 10% of the minimum pattern line width.

Figure 7D:
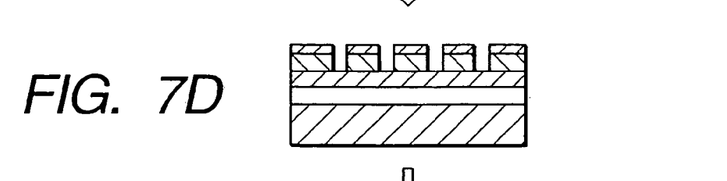
Figure 7E:
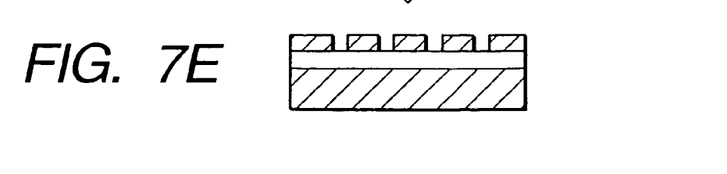

Subsequently, using the micropatterns transferred on the photoresist layer 302 as the photomask, the patterning of the SOG layer 304 was performed by dry etching (FIG. 7D). With the thus fabricated micropatterns on the SOG layer 304 as the photomask, the buffer layer 301 was processed by means of the oxygen RIE (FIG. 7E). According to the above-mentioned procedures, the micropatterns having the minimum pattern line width of 50 nm on the photomask were transferred onto the upper Si layer on the insulating film with distinct contrast. The high aspect ratio of the micropatterns due to the photoresist on the SOI substrate 303 allowed formation of the micropatterns which facilitated the subsequent device fabrication processes.

What is claimed is:

1. A method for fabricating a device, comprising the steps of:

forming on a substrate a photosensitive layer not larger than 100 nm in thickness, wherein the photosensitive photoresist layer comprising an alkali soluble novolak resin and photosensitive compound having a naphthoquinone diazide group, and absorption coefficient α

μm$^{-1}$ of the photoresist layer for an exposure light having a wavelength of 325 to 500 nm falls in the range of $0.5 \leq \alpha \leq 7$;

exposing the photosensitive photoresist layer to near-field light through a photomask having a light-shielding film and microapertures in the light-shielding film using the exposure light having a wavelength of 325 to 500 nm;

forming a pattern based on the microapertures by developing the photosensitive photoresist layer; and etching a surface of the substrate based on the pattern.

2. The method for fabricating a device as set forth in claim 1, which further comprises the steps of:

forming a buffer layer between the substrate and the photosensitive photoresist layer; and etching the buffer layer based on the pattern formed in the photosensitive photoresist layer.

3. The method for fabricating a device as set forth in claim 1, wherein the photosensitive photoresist layer contains Si.

* * * * *